(12) United States Patent
Mishra et al.

(10) Patent No.: US 11,508,554 B2
(45) Date of Patent: Nov. 22, 2022

(54) HIGH VOLTAGE FILTER ASSEMBLY

(71) Applicant: Applied Materials, Inc., Santa Clara, CA (US)

(72) Inventors: Anurag Kumar Mishra, Fremont, CA (US); James Rogers, Los Gatos, CA (US); Leonid Dorf, San Jose, CA (US); Rajinder Dhindsa, Pleasanton, CA (US); Olivier Luere, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 16/355,153

(22) Filed: Mar. 15, 2019

(65) Prior Publication Data

US 2020/0243303 A1 Jul. 30, 2020

Related U.S. Application Data

(60) Provisional application No. 62/796,542, filed on Jan. 24, 2019.

(51) Int. Cl.
*H01J 37/32* (2006.01)
*H01L 21/683* (2006.01)

(52) U.S. Cl.
CPC .. *H01J 37/32174* (2013.01); *H01J 37/32027* (2013.01); *H01J 37/32036* (2013.01);
(Continued)

(58) Field of Classification Search
USPC ...................................... 156/345.52; 118/725
See application file for complete search history.

(56) References Cited

U.S. PATENT DOCUMENTS

| 4,070,589 A | 1/1978 | Martinkovic |
|---|---|---|
| 4,340,462 A | 7/1982 | Koch |

(Continued)

FOREIGN PATENT DOCUMENTS

| CN | 101707186 B | 2/2012 |
|---|---|---|
| CN | 104752134 A | 7/2015 |

(Continued)

OTHER PUBLICATIONS

International Search Report and Written Opinion for PCT/US2019/052067 dated Jan. 21, 2020.

(Continued)

*Primary Examiner* — Ram N Kackar
(74) *Attorney, Agent, or Firm* — Patterson + Sheridan, LLP

(57) ABSTRACT

Embodiments described herein are applicable for use in all types of plasma assisted or plasma enhanced processing chambers and also for methods of plasma assisted or plasma enhanced processing of a substrate. More specifically, embodiments of this disclosure include a broadband filter assembly, also referred to herein as a filter assembly, that is configured to reduce and/or prevent RF leakage currents from being transferred from one or more RF driven components to a ground through other electrical components that are directly or indirectly electrically coupled to the RF driven components and ground with high input impedance (low current loss) making it compatible with shaped DC pulse bias applications.

16 Claims, 4 Drawing Sheets

(52) U.S. Cl.
CPC .. *H01J 37/32165* (2013.01); *H01J 37/32577* (2013.01); *H01J 37/32724* (2013.01); *H01L 21/6833* (2013.01); *H01J 2237/3341* (2013.01)

(56) References Cited

U.S. PATENT DOCUMENTS

| | | | |
|---|---|---|---|
| 4,464,223 | A | 8/1984 | Gorin |
| 4,504,895 | A | 3/1985 | Steigerwald |
| 4,585,516 | A | 4/1986 | Corn et al. |
| 4,683,529 | A | 7/1987 | Bucher, II |
| 4,931,135 | A | 6/1990 | Horiuchi et al. |
| 4,992,919 | A | 2/1991 | Lee et al. |
| 5,099,697 | A | 3/1992 | Agar |
| 5,140,510 | A | 8/1992 | Myers |
| 5,449,410 | A | 9/1995 | Chang et al. |
| 5,451,846 | A | 9/1995 | Peterson et al. |
| 5,464,499 | A | 11/1995 | Moslehi et al. |
| 5,554,959 | A | 9/1996 | Tang |
| 5,565,036 | A | 10/1996 | Westendorp et al. |
| 5,595,627 | A | 1/1997 | Inazawa et al. |
| 5,597,438 | A | 1/1997 | Grewal et al. |
| 5,610,452 | A | 3/1997 | Shimer et al. |
| 5,698,062 | A | 12/1997 | Sakamoto et al. |
| 5,716,534 | A | 2/1998 | Tsuchiya et al. |
| 5,770,023 | A | 6/1998 | Sellers |
| 5,796,598 | A | 8/1998 | Nowak et al. |
| 5,810,982 | A | 9/1998 | Sellers |
| 5,830,330 | A | 11/1998 | Lantsman |
| 5,882,424 | A | 3/1999 | Taylor et al. |
| 5,928,963 | A | 7/1999 | Koshiishi |
| 5,933,314 | A | 8/1999 | Lambson et al. |
| 5,935,373 | A | 8/1999 | Koshimizu |
| 5,948,704 | A | 9/1999 | Benjamin et al. |
| 5,997,687 | A | 12/1999 | Koshimizu |
| 6,043,607 | A | 3/2000 | Roderick |
| 6,051,114 | A | 4/2000 | Yao et al. |
| 6,055,150 | A | 4/2000 | Clinton et al. |
| 6,074,518 | A | 6/2000 | Imafuku et al. |
| 6,089,181 | A | 7/2000 | Suemasa et al. |
| 6,099,697 | A | 8/2000 | Hausmann |
| 6,110,287 | A | 8/2000 | Arai et al. |
| 6,117,279 | A | 9/2000 | Smolanoff et al. |
| 6,125,025 | A | 9/2000 | Howald et al. |
| 6,133,557 | A | 10/2000 | Kawanabe et al. |
| 6,136,387 | A | 10/2000 | Koizumi |
| 6,187,685 | B1 | 2/2001 | Hopkins et al. |
| 6,197,151 | B1 | 3/2001 | Kaji et al. |
| 6,198,616 | B1 | 3/2001 | Dahimene et al. |
| 6,201,208 | B1 | 3/2001 | Wendt et al. |
| 6,214,162 | B1 | 4/2001 | Koshimizu |
| 6,232,236 | B1 | 5/2001 | Shan et al. |
| 6,252,354 | B1 | 6/2001 | Collins et al. |
| 6,253,704 | B1 | 7/2001 | Savas |
| 6,277,506 | B1 | 8/2001 | Okamoto |
| 6,309,978 | B1 | 10/2001 | Donohoe et al. |
| 6,313,583 | B1 | 11/2001 | Arita et al. |
| 6,355,992 | B1 | 3/2002 | Via |
| 6,358,573 | B1 | 3/2002 | Raoux et al. |
| 6,392,187 | B1 | 5/2002 | Johnson |
| 6,395,641 | B2 | 5/2002 | Savas |
| 6,423,192 | B1 | 7/2002 | Wada et al. |
| 6,433,297 | B1 | 8/2002 | Kojima et al. |
| 6,435,131 | B1 | 8/2002 | Koizumi |
| 6,451,389 | B1 | 9/2002 | Amann et al. |
| 6,456,010 | B2 | 9/2002 | Yamakoshi et al. |
| 6,483,731 | B1 | 11/2002 | Isurin et al. |
| 6,535,785 | B2 | 3/2003 | Johnson et al. |
| 6,621,674 | B1 | 9/2003 | Zahringer et al. |
| 6,664,739 | B1 | 12/2003 | Kishinevsky et al. |
| 6,733,624 | B2 | 5/2004 | Koshiishi et al. |
| 6,740,842 | B2 | 5/2004 | Johnson et al. |
| 6,741,446 | B2 | 5/2004 | Ennis |
| 6,777,037 | B2 | 8/2004 | Sumiya et al. |
| 6,808,607 | B2 | 10/2004 | Christie |
| 6,818,103 | B1 | 11/2004 | Scholl et al. |
| 6,818,257 | B2 | 11/2004 | Amann et al. |
| 6,830,595 | B2 | 12/2004 | Reynolds, III |
| 6,830,650 | B2 | 12/2004 | Roche et al. |
| 6,849,154 | B2 | 2/2005 | Nagahata et al. |
| 6,861,373 | B2 | 3/2005 | Aoki et al. |
| 6,863,020 | B2 | 3/2005 | Mitrovic et al. |
| 6,896,775 | B2 | 5/2005 | Chistyakov |
| 6,902,646 | B2 | 6/2005 | Mahoney et al. |
| 6,917,204 | B2 | 7/2005 | Mitrovic et al. |
| 6,947,300 | B2 | 9/2005 | Pai et al. |
| 6,962,664 | B2 | 11/2005 | Mitrovic |
| 6,970,042 | B2 | 11/2005 | Glueck |
| 7,016,620 | B2 | 3/2006 | Maess et al. |
| 7,046,088 | B2 | 5/2006 | Ziegler |
| 7,104,217 | B2 | 9/2006 | Himori et al. |
| 7,115,185 | B1 | 10/2006 | Gonzalez et al. |
| 7,126,808 | B2 | 10/2006 | Koo et al. |
| 7,147,759 | B2 | 12/2006 | Chistyakov |
| 7,151,242 | B2 | 12/2006 | Schuler |
| 7,166,233 | B2 | 1/2007 | Johnson et al. |
| 7,206,189 | B2 | 4/2007 | Reynolds, III |
| 7,218,503 | B2 | 5/2007 | Howald |
| 7,218,872 | B2 | 5/2007 | Shimomura |
| 7,226,868 | B2 | 6/2007 | Mosden et al. |
| 7,265,963 | B2 | 9/2007 | Hirose |
| 7,274,266 | B2 | 9/2007 | Kirchmeier |
| 7,305,311 | B2 | 12/2007 | van Zyl |
| 7,312,974 | B2 | 12/2007 | Kuchimachi |
| 7,408,329 | B2 | 8/2008 | Wiedemuth et al. |
| 7,415,940 | B2 | 8/2008 | Koshimizu et al. |
| 7,440,301 | B2 | 10/2008 | Kirchmeier et al. |
| 7,452,443 | B2 | 11/2008 | Gluck et al. |
| 7,479,712 | B2 | 1/2009 | Richert |
| 7,509,105 | B2 | 3/2009 | Ziegler |
| 7,512,387 | B2 | 3/2009 | Glueck |
| 7,535,688 | B2 | 5/2009 | Yokouchi et al. |
| 7,586,099 | B2 | 9/2009 | Eyhorn et al. |
| 7,586,210 | B2 | 9/2009 | Wiedemuth et al. |
| 7,588,667 | B2 | 9/2009 | Cerio, Jr. |
| 7,601,246 | B2 | 10/2009 | Kim et al. |
| 7,609,740 | B2 | 10/2009 | Glueck |
| 7,618,686 | B2 | 11/2009 | Colpo |
| 7,633,319 | B2 | 12/2009 | Arai |
| 7,645,341 | B2 | 1/2010 | Kennedy et al. |
| 7,651,586 | B2 | 1/2010 | Moriya et al. |
| 7,652,901 | B2 | 1/2010 | Kirchmeier et al. |
| 7,692,936 | B2 | 4/2010 | Richter |
| 7,700,474 | B2 | 4/2010 | Cerio, Jr. |
| 7,705,676 | B2 | 4/2010 | Kirchmeier et al. |
| 7,706,907 | B2 | 4/2010 | Hiroki |
| 7,712,436 | B2 * | 5/2010 | Yamazawa ........ H01J 37/32091 156/345.52 |
| 7,718,538 | B2 | 5/2010 | Kim et al. |
| 7,740,704 | B2 | 6/2010 | Strang |
| 7,758,764 | B2 | 7/2010 | Dhindsa et al. |
| 7,761,247 | B2 | 7/2010 | van Zyl |
| 7,782,100 | B2 | 8/2010 | Steuber et al. |
| 7,791,912 | B2 | 9/2010 | Walde |
| 7,795,817 | B2 | 9/2010 | Nitschke |
| 7,808,184 | B2 | 10/2010 | Chistyakov |
| 7,821,767 | B2 | 10/2010 | Fujii |
| 7,825,719 | B2 | 11/2010 | Roberg et al. |
| 7,858,533 | B2 | 12/2010 | Liu et al. |
| 7,888,240 | B2 | 2/2011 | Hamamjy et al. |
| 7,898,238 | B2 | 3/2011 | Wiedemuth et al. |
| 7,929,261 | B2 | 4/2011 | Wiedemuth |
| RE42,362 | E | 5/2011 | Schuler |
| 7,977,256 | B2 | 7/2011 | Liu et al. |
| 7,988,816 | B2 | 8/2011 | Koshiishi et al. |
| 7,995,313 | B2 | 8/2011 | Nitschke |
| 8,044,595 | B2 | 10/2011 | Nitschke |
| 8,052,798 | B2 | 11/2011 | Moriya et al. |
| 8,055,203 | B2 | 11/2011 | Choueiry et al. |
| 8,083,961 | B2 | 12/2011 | Chen et al. |
| 8,110,992 | B2 | 2/2012 | Nitschke |
| 8,128,831 | B2 | 3/2012 | Sato et al. |
| 8,129,653 | B2 | 3/2012 | Kirchmeier et al. |
| 8,133,347 | B2 | 3/2012 | Gluck et al. |
| 8,133,359 | B2 | 3/2012 | Nauman et al. |

(56) References Cited

U.S. PATENT DOCUMENTS

| | | | |
|---|---|---|---|
| 8,140,292 | B2 | 3/2012 | Wendt |
| 8,217,299 | B2 | 7/2012 | Ilic et al. |
| 8,221,582 | B2 | 7/2012 | Patrick et al. |
| 8,236,109 | B2 | 8/2012 | Moriya et al. |
| 8,284,580 | B2 | 10/2012 | Wilson |
| 8,313,612 | B2 | 11/2012 | McMillin et al. |
| 8,333,114 | B2 | 12/2012 | Hayashi |
| 8,361,906 | B2 | 1/2013 | Lee et al. |
| 8,382,999 | B2 | 2/2013 | Agarwal et al. |
| 8,383,001 | B2 | 2/2013 | Mochiki et al. |
| 8,384,403 | B2 | 2/2013 | Zollner et al. |
| 8,391,025 | B2 | 3/2013 | Walde et al. |
| 8,399,366 | B1 | 3/2013 | Takaba |
| 8,419,959 | B2 | 4/2013 | Bettencourt et al. |
| 8,422,193 | B2 | 4/2013 | Tao et al. |
| 8,441,772 | B2 | 5/2013 | Yoshikawa et al. |
| 8,456,220 | B2 | 6/2013 | Thome et al. |
| 8,460,567 | B2 | 6/2013 | Chen |
| 8,466,622 | B2 | 6/2013 | Knaus |
| 8,542,076 | B2 | 9/2013 | Maier |
| 8,551,289 | B2 | 10/2013 | Nishimura et al. |
| 8,568,606 | B2 | 10/2013 | Ohse et al. |
| 8,603,293 | B2 | 12/2013 | Koshiishi et al. |
| 8,632,537 | B2 | 1/2014 | McNall, III et al. |
| 8,641,916 | B2 | 2/2014 | Yatsuda et al. |
| 8,685,267 | B2 | 4/2014 | Yatsuda et al. |
| 8,704,607 | B2 | 4/2014 | Yuzurihara et al. |
| 8,716,114 | B2 | 5/2014 | Ohmi et al. |
| 8,716,984 | B2 | 5/2014 | Mueller et al. |
| 8,735,291 | B2 | 5/2014 | Ranjan et al. |
| 8,796,933 | B2 | 8/2014 | Hermanns |
| 8,809,199 | B2 | 8/2014 | Nishizuka |
| 8,821,684 | B2 | 9/2014 | Ui et al. |
| 8,828,883 | B2 | 9/2014 | Rueger |
| 8,845,810 | B2 | 9/2014 | Hwang |
| 8,852,347 | B2 | 10/2014 | Lee et al. |
| 8,884,523 | B2 | 11/2014 | Winterhalter et al. |
| 8,884,525 | B2 | 11/2014 | Hoffman et al. |
| 8,889,534 | B1 | 11/2014 | Ventzek et al. |
| 8,895,942 | B2 | 11/2014 | Liu et al. |
| 8,907,259 | B2 | 12/2014 | Kasai et al. |
| 8,916,056 | B2 | 12/2014 | Koo et al. |
| 8,926,850 | B2 | 1/2015 | Singh et al. |
| 8,963,377 | B2 | 2/2015 | Ziemba et al. |
| 8,979,842 | B2 | 3/2015 | McNall, III et al. |
| 8,993,943 | B2 | 3/2015 | Pohl et al. |
| 9,011,636 | B2 | 4/2015 | Ashida |
| 9,039,871 | B2 | 5/2015 | Nauman et al. |
| 9,042,121 | B2 | 5/2015 | Walde et al. |
| 9,053,908 | B2 | 6/2015 | Sriraman et al. |
| 9,059,178 | B2 | 6/2015 | Matsumoto et al. |
| 9,087,798 | B2 | 7/2015 | Ohtake et al. |
| 9,101,038 | B2 | 8/2015 | Singh et al. |
| 9,105,447 | B2 | 8/2015 | Brouk et al. |
| 9,105,452 | B2 | 8/2015 | Jeon et al. |
| 9,123,762 | B2 | 9/2015 | Lin et al. |
| 9,129,776 | B2 | 9/2015 | Finley et al. |
| 9,139,910 | B2 | 9/2015 | Lee et al. |
| 9,147,555 | B2 | 9/2015 | Richter |
| 9,150,960 | B2 | 10/2015 | Nauman et al. |
| 9,159,575 | B2 | 10/2015 | Ranjan et al. |
| 9,208,992 | B2 | 12/2015 | Brouk et al. |
| 9,209,032 | B2 | 12/2015 | Zhao et al. |
| 9,209,034 | B2 | 12/2015 | Kitamura et al. |
| 9,210,790 | B2 | 12/2015 | Hoffman et al. |
| 9,224,579 | B2 | 12/2015 | Finley et al. |
| 9,226,380 | B2 | 12/2015 | Finley |
| 9,228,878 | B2 | 1/2016 | Haw et al. |
| 9,254,168 | B2 | 2/2016 | Palanker |
| 9,263,241 | B2 | 2/2016 | Larson et al. |
| 9,287,086 | B2 | 3/2016 | Brouk et al. |
| 9,287,092 | B2 | 3/2016 | Brouk et al. |
| 9,287,098 | B2 | 3/2016 | Finley |
| 9,306,533 | B1 | 4/2016 | Mavretic |
| 9,309,594 | B2 | 4/2016 | Hoffman et al. |
| 9,313,872 | B2 | 4/2016 | Yamazawa |
| 9,355,822 | B2 | 5/2016 | Yamada et al. |
| 9,362,089 | B2 | 6/2016 | Brouk et al. |
| 9,373,521 | B2 | 6/2016 | Mochiki et al. |
| 9,384,992 | B2 | 7/2016 | Narishige et al. |
| 9,396,960 | B2 | 7/2016 | Ogawa et al. |
| 9,404,176 | B2 | 8/2016 | Parkhe et al. |
| 9,412,613 | B2 | 8/2016 | Manna et al. |
| 9,435,029 | B2 | 9/2016 | Brouk et al. |
| 9,483,066 | B2 | 11/2016 | Finley |
| 9,490,107 | B2 | 11/2016 | Kim et al. |
| 9,495,563 | B2 | 11/2016 | Ziemba et al. |
| 9,496,150 | B2 | 11/2016 | Mochiki et al. |
| 9,503,006 | B2 | 11/2016 | Pohl et al. |
| 9,520,269 | B2 | 12/2016 | Finley et al. |
| 9,530,667 | B2 | 12/2016 | Rastogi et al. |
| 9,536,713 | B2 | 1/2017 | Van Zyl et al. |
| 9,544,987 | B2 | 1/2017 | Mueller et al. |
| 9,558,917 | B2 | 1/2017 | Finley et al. |
| 9,564,287 | B2 | 2/2017 | Ohse et al. |
| 9,570,313 | B2 | 2/2017 | Ranjan et al. |
| 9,576,810 | B2 | 2/2017 | Deshmukh et al. |
| 9,576,816 | B2 | 2/2017 | Rastogi et al. |
| 9,577,516 | B1 | 2/2017 | Van Zyl |
| 9,583,357 | B1 | 2/2017 | Long et al. |
| 9,601,283 | B2 | 3/2017 | Ziemba et al. |
| 9,601,319 | B1 | 3/2017 | Bravo et al. |
| 9,607,843 | B2 | 3/2017 | Rastogi et al. |
| 9,620,340 | B2 | 4/2017 | Finley |
| 9,620,376 | B2 | 4/2017 | Kamp et al. |
| 9,620,987 | B2 | 4/2017 | Alexander et al. |
| 9,637,814 | B2 | 5/2017 | Bugyi et al. |
| 9,644,221 | B2 | 5/2017 | Kanamori et al. |
| 9,651,957 | B1 | 5/2017 | Finley |
| 9,655,221 | B2 | 5/2017 | Ziemba et al. |
| 9,663,858 | B2 | 5/2017 | Nagami et al. |
| 9,666,446 | B2 | 5/2017 | Tominaga et al. |
| 9,666,447 | B2 | 5/2017 | Rastogi et al. |
| 9,673,027 | B2 | 6/2017 | Yamamoto et al. |
| 9,673,059 | B2 | 6/2017 | Raley et al. |
| 9,685,297 | B2 | 6/2017 | Carter et al. |
| 9,706,630 | B2 | 7/2017 | Miller et al. |
| 9,711,331 | B2 | 7/2017 | Mueller et al. |
| 9,711,335 | B2 | 7/2017 | Christie |
| 9,728,429 | B2 | 8/2017 | Ricci et al. |
| 9,734,992 | B2 | 8/2017 | Yamada et al. |
| 9,741,544 | B2 | 8/2017 | Van Zyl |
| 9,754,768 | B2 | 9/2017 | Yamada et al. |
| 9,761,419 | B2 | 9/2017 | Nagami |
| 9,761,459 | B2 | 9/2017 | Long et al. |
| 9,767,988 | B2 | 9/2017 | Brouk et al. |
| 9,786,503 | B2 | 10/2017 | Raley et al. |
| 9,799,494 | B2 | 10/2017 | Chen et al. |
| 9,805,916 | B2 | 10/2017 | Konno et al. |
| 9,805,965 | B2 | 10/2017 | Sadjadi et al. |
| 9,812,305 | B2 | 11/2017 | Pelleymounter |
| 9,831,064 | B2 | 11/2017 | Konno et al. |
| 9,837,285 | B2 | 12/2017 | Tomura et al. |
| 9,840,770 | B2 | 12/2017 | Klimczak et al. |
| 9,852,889 | B1 | 12/2017 | Kellogg et al. |
| 9,852,890 | B2 | 12/2017 | Mueller et al. |
| 9,865,471 | B2 | 1/2018 | Shimoda et al. |
| 9,865,893 | B2 | 1/2018 | Esswein et al. |
| 9,870,898 | B2 | 1/2018 | Urakawa et al. |
| 9,872,373 | B1 | 1/2018 | Shimizu |
| 9,881,820 | B2 | 1/2018 | Wong et al. |
| 9,922,802 | B2 | 3/2018 | Hirano et al. |
| 9,922,806 | B2 | 3/2018 | Tomura et al. |
| 9,929,004 | B2 | 3/2018 | Ziemba et al. |
| 9,941,097 | B2 | 4/2018 | Yamazawa et al. |
| 9,941,098 | B2 | 4/2018 | Nagami |
| 9,960,763 | B2 | 5/2018 | Miller et al. |
| 9,972,503 | B2 | 5/2018 | Tomura et al. |
| 9,997,374 | B2 | 6/2018 | Takeda et al. |
| 10,020,800 | B2 | 7/2018 | Prager et al. |
| 10,026,593 | B2 | 7/2018 | Alt et al. |
| 10,027,314 | B2 | 7/2018 | Prager et al. |
| 10,041,174 | B2 | 8/2018 | Matsumoto et al. |
| 10,042,407 | B2 | 8/2018 | Grede et al. |

(56) References Cited

U.S. PATENT DOCUMENTS

| | | |
|---|---|---|
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |

(56) References Cited

U.S. PATENT DOCUMENTS

| | | |
|---|---|---|
| 2007/0284344 A1* | 12/2007 | Todorov ............ H01J 37/32706 219/121.54 |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima |
| 2009/0133839 A1* | 5/2009 | Yamazawa ........ H01J 37/32724 156/345.37 |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman |
| 2012/0319584 A1 | 12/2012 | Brouk et al. |
| 2013/0059448 A1 | 3/2013 | Marakhtanov |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1* | 9/2014 | Deshmukh ........ H01J 37/32146 438/714 |
| 2014/0302256 A1* | 10/2014 | Chen ....................... C23C 16/46 118/500 |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1* | 8/2015 | Ito ..................... H01J 37/32165 156/345.48 |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |

(56) References Cited

U.S. PATENT DOCUMENTS

| | | |
|---|---|---|
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0234922 A1 | 7/2020 | Dorf |
| 2020/0234923 A1 | 7/2020 | Dorf |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |

FOREIGN PATENT DOCUMENTS

| | | |
|---|---|---|
| CN | 106206234 A | 12/2016 |
| CN | 104752134 B | 2/2017 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 6741461 B2 | 8/2020 |
| KR | 20160042429 A | 4/2016 |
| WO | 2000017920 A1 | 3/2000 |
| WO | 2002059954 A1 | 8/2002 |
| WO | 2008050619 A1 | 5/2008 |
| WO | 2012076630 A1 | 6/2012 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2015073921 A8 | 5/2016 |
| WO | 2016131061 A1 | 8/2016 |
| WO | 2017172536 A1 | 10/2017 |
| WO | 2018048925 A1 | 3/2018 |
| WO | 2018170010 A1 | 9/2018 |
| WO | 2019036587 A1 | 2/2019 |
| WO | 2019040949 A1 | 2/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Kamada, Keiichi, et al., Editors—"New Developments of Plasma Science with Pulsed Power Technology," Research Report, NIFS-

(56) References Cited

OTHER PUBLICATIONS

PROC-82, presented at National Institute for Fusion Science, Toki, Gifu, Japan, Mar. 5-6, 2009, 109 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

Semiconductor Components Industries, LLC (SCILLC)—"Switch-Mode Power Supply" Reference Manual, SMPSRM/D, Rev. 4, Apr. 2014, ON Semiconductor, 73 pages.

Sunstone Circuits—"Eagle Harbor Tech Case Study," date unknown, 4 pages.

Electrical 4 U webpage—"Clamping Circuit," Aug. 29, 2018, 1 page.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Richard Barnett et al. A New Plasma Source for Next Generation MEMS Deep Si Etching: Minimal Tilt, Improved Profile Uniformity and Higher Etch Rates, SPP Process Technology Systems. 2010.

Lin, Jianliang, et al.,—"Diamond like carbon films deposited by HiPIMS using oscillatory voltage pulses," Surface & Coatings Technology 258, 2014, published by Elsevier B.V., pp. 1212-1222.

Yiting Zhang et al. "Investigation of feature orientation and consequences of ion tilting during plasma etching with a three-dimensional feature profile simulator", Nov. 22, 2016.

S.B. Wang et al. "Ion Bombardment Energy and SiO 2/Si Fluorocarbon Plasma Etch Selectivity", Journal of Vacuum Science & Technology A 19, 2425 (2001).

Zhen-hua Bi et al., A brief review of dual-frequency capacitively coupled discharges, Current Applied Physics, vol. 11, Issue 5, Supplement, 2011, pp. S2-S8.

Chang, Bingdong, "Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.

Dr. Steve Sirard, "Introduction to Plasma Etching", Lam Research Corporation. 64 pages.

Zhuoxing Luo, B.S., M.S, "RF Plasma Etching With A DC Bias" A Dissertation in Physics. Dec. 1994.

Michael A. Lieberman, "Principles of Plasma Discharges and Material Processing", A Wiley Interscience Publication. 1994.

\* cited by examiner

HIGH VOLTAGE FILTER ASSEMBLY

CROSS-REFERENCE TO RELATED APPLICATIONS

This application claims benefit of U.S. Provisional Patent Application Ser. No. 62/796,542, filed Jan. 24, 2019, which application is hereby incorporated by reference herein.

FIELD

Embodiments described herein generally relate to plasma processing chambers used in semiconductor manufacturing.

BACKGROUND

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A challenge for current plasma processing chambers and processes includes controlling critical dimension uniformity during plasma processing, which requires heating of the electrostatic chuck assembly in a controlled way. A multi-zone heating assembly embedded in dielectric material is used to heat electrostatic chuck assembly. A typical Reactive Ion Etch (RIE) plasma processing chamber includes a radio frequency (RF) bias generator, which supplies an RF voltage to a "power electrode", a metal baseplate embedded into the substrate support assembly, more commonly referred to as the "cathode". The power RF biased electrode is capacitively coupled to the multi-zone electrostatic chuck heating assembly via a layer of dielectric material (e.g., ceramic material), which is a part of the ESC assembly. The strong capacitive coupling between power electrode and the multi-zone electrostatic chuck heating provides a path for flow of significant RF currents to ground, which results in loading of the RF biased waveform and loss of RF power. An undesirably large flow of RF current from the RF driven components to the grounded hardware components can cause many undesirable effects, which include a reduction in the amount of RF power that can effectively be provided to the power electrode (i.e., reduces the RF transfer efficiency), can create personnel safety issues and can cause unwanted damage to ancillary electrical and hardware components. The ability to prevent these undesirable effects becomes even harder to accomplish when the RF power provided to the power electrode includes a broad range of RF frequencies. Most traditional RF filtering techniques are tuned to block the narrow range of frequencies that are provided from the RF power supply to prevent the generated RF energy from damaging external and ancillary electrical components that are connected to the RF driven circuit. As semiconductor device aspect ratios become higher, higher ion energy is required to etch these features. To achieve higher ion energy, the trend is to move to lower frequency and higher power, which makes filter design even more challenging. In particular, shaped DC pulse can be used which is low frequency and has a broad frequency spectrum, which is the most difficult to filter using conventional filtering designs.

Therefore, there is a need for an apparatus and method of minimizing and/or preventing undesirably large RF currents from being delivered to ground through one or more grounded chamber hardware components.

SUMMARY

In one example, a filter assembly is disclosed. The filter assembly includes a plurality of impedance producing elements that are electrically coupled in series between an input end and an output end of the filter assembly. The filter assembly further includes a first grounded impedance producing element. The filter assembly further includes a second grounded impedance producing element. The impedance producing elements are electrically coupled together in series by a first conductive lead and a second conductive lead. The impedance producing elements each comprise a common mode choke that is formed by winding the first and second conductive leads around a toroid shaped core. The first grounded impedance producing element is coupled to the first conductive lead at a point between two adjacently positioned series connected impedance producing elements and to ground. The second grounded impedance producing element is coupled to the second conductive lead at a point between the two adjacently positioned series connected impedance producing elements and to ground.

In another embodiment, a plasma processing chamber is disclosed. The plasma processing chamber includes a biasing electrode disposed within a substrate support. The biasing electrode is configured to be driven by a power generator. The plasma processing chamber further includes a conductive element disposed within the substrate support and positioned a distance from the biasing electrode. The plasma processing chamber further includes a filter assembly. The filter assembly includes a plurality of impedance producing elements that are electrically coupled in series between an input end and an output end of the filter assembly. The filter assembly further includes a first grounded impedance producing element. The filter assembly further includes a second grounded impedance producing element. The impedance producing elements are electrically coupled together in series by a first conductive lead and a second conductive lead. The impedance producing elements each comprise a common mode choke that is formed by winding the first and second conductive leads around a toroid shaped core. The first grounded impedance producing element is coupled to the first conductive lead at a point between two adjacently positioned series connected impedance producing elements and to ground. The second grounded impedance producing element is coupled to the second conductive lead at a point between the two adjacently positioned series connected impedance producing elements and to the ground. The first conductive lead and the second conductive lead connect the conductive element to an external electrical component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein are applicable for use in all types of plasma assisted or plasma enhanced processing chambers and also for methods of plasma assisted or plasma enhanced processing of a substrate. More specifically, embodiments of this disclosure include a broadband frequency filter assembly, also referred to herein as a filter assembly, that is configured to reduce and/or prevent RF leakage currents from being transferred from one or more RF driven components to a ground through other electrical components that are directly or indirectly electrically coupled to the RF driven components and ground.

Figure 1:
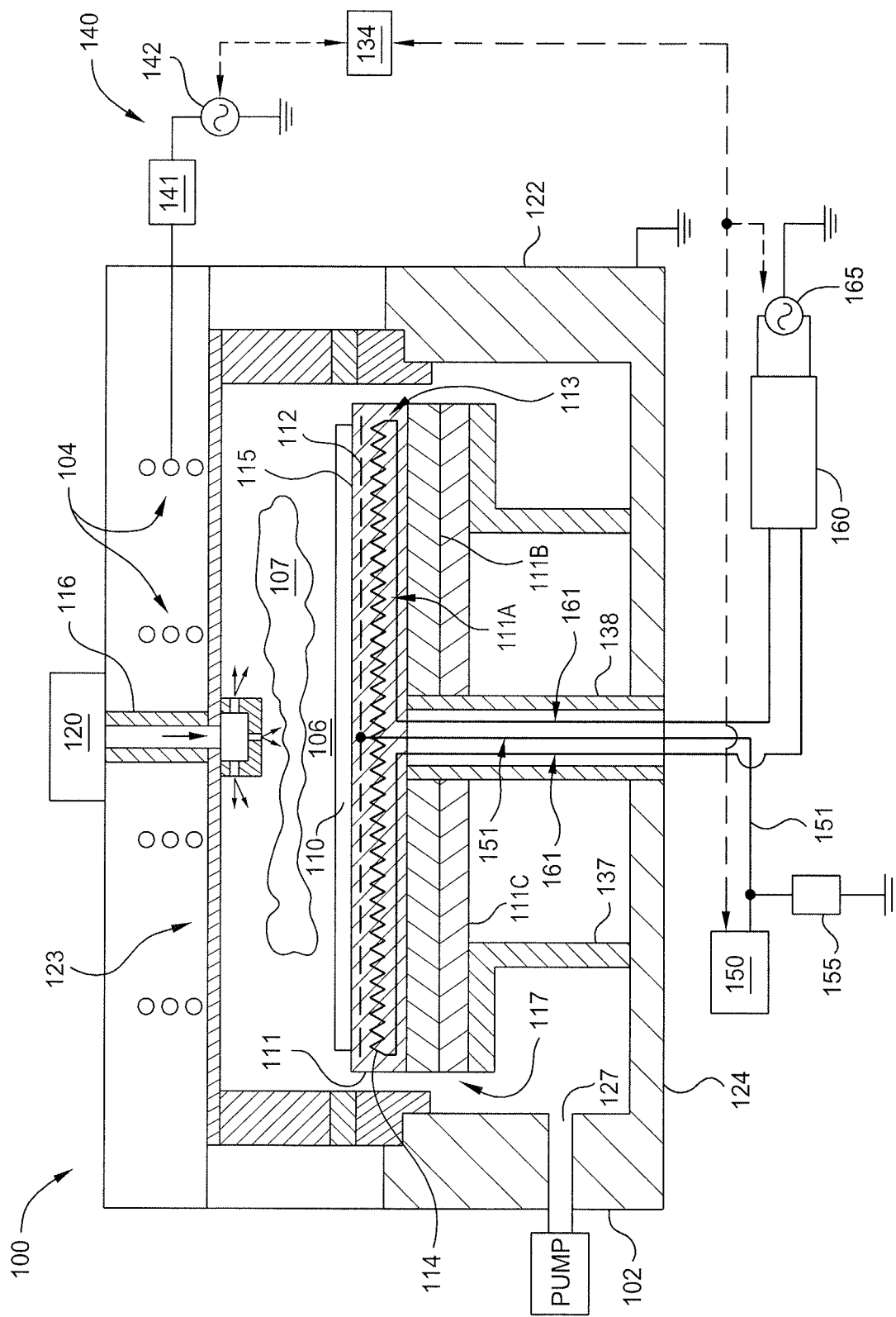
FIG. 1 is a schematic cross-sectional view of an example processing chamber configured to practice methods described herein, according to one embodiment.

FIG. 1 is a schematic cross-sectional view of a processing chamber 100 configured to perform a plasma process within a processing volume 106 of the process chamber 100 by use of a source assembly 140, according to one embodiment. In this embodiment, the processing chamber 100 is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. Herein, as shown in FIG. 1, the processing chamber 100 includes a source assembly 140 that includes an inductively coupled plasma (ICP) source electrically coupled to a radio frequency (RF) power supply 142 through an RF matching circuit 141. In other embodiments, the source assembly 140 is a capacitively coupled plasma (CCP) source, such as a source electrode (not shown) disposed in the processing volume 106 facing the substrate support 111, wherein the source electrode is electrically coupled to an RF power supply (not shown).

The processing chamber 100 includes a chamber body 102 which includes a chamber lid 123, one or more sidewalls 122, and a chamber base 124 which define a processing volume 106. A gas inlet 116 disposed through the chamber lid 123 is used to provide one or more processing gases to the processing volume 106 from a processing gas source 120 in fluid communication therewith. Herein, the power supply 142 is configured to ignite and maintain a processing plasma 107 from the processing gases includes one or more inductive coils 104 disposed proximate to the chamber lid 123 outside of the processing volume 106. The power supply 142 is used to ignite and maintain a plasma 107 using the processing gases and electromagnetic field generated by the inductive coils 104 and RF power supply 142. The processing volume 106 is fluidly coupled to one or more dedicated vacuum pumps, through a vacuum outlet 127, which maintain the processing volume 106 at sub-atmospheric conditions and evacuate processing, and/or other gases, therefrom. A substrate support assembly 117, disposed in the processing volume 106, is disposed on a support shaft 138 sealingly extending through the chamber base 124.

The substrate 110 is loaded into, and removed from, the processing volume 106 through an opening (not shown) in one of the one or more sidewalls 122, which is sealed with a door or a valve (not shown) during plasma processing of the substrate 110. Herein, the substrate 110 is transferred to and from a receiving surface 115 (e.g., substrate supporting surface) of a substrate support 111, which can include an ESC substrate support 111A using a lift pin system (not shown).

The substrate support 111 includes a support base 111B and the ESC substrate support 111A that is thermally coupled to, and disposed on, the support base 111B. The support base 111B is electrically isolated from the chamber base 124 by an insulator plate 111C, and a ground plate 137 that is interposed between the insulator plate 111C and the chamber base 124. Typically, the support base 111B is used to regulate the temperature of the ESC substrate support 111A, and the substrate 110 disposed on the ESC substrate support 111A, during substrate processing. In some embodiments, the support base 111B includes one or more cooling channels (not shown) disposed therein that are fluidly coupled to, and in fluid communication with, a coolant source (not shown), such as a refrigerant source or water source having relatively high electrical resistance. Herein, the support base 111B is formed of a corrosion resistant thermally conductive material, such as a corrosion resistant metal, for example aluminum, aluminum alloy, or stainless steel and is coupled to the substrate support with an adhesive or by mechanical means.

Typically, the ESC substrate support 111A is formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In some embodiments herein, the ESC substrate support 111A further includes a biasing electrode 112 embedded in the dielectric material thereof. In one configuration, the biasing electrode 112 is a chucking pole used to secure (chuck) the substrate 110 to the receiving surface 115 of the ESC substrate support 111A and to bias the substrate 110 with respect to the processing plasma 107. Typically, the biasing electrode 112 is formed of one or more electrically conductive parts, such as one or more metal meshes, foils, plates, or combinations thereof. Herein, the biasing electrode 112 is electrically coupled to a high voltage module 155 which provides a chucking voltage thereto, such as static DC voltage between about −5000 V and about 5000 V, using an electrical conductor, such as the transmission line 151.

In some embodiments, the ESC substrate support 111A includes a heater element 113, such as a resistive heating element embedded in the dielectric material of the ESC substrate support 111A. The heater element 113 is used to generate heat within the ESC substrate support 111A due to resistive heating created by the delivery of AC power through one or more conductive elements 114, which are embedded within the material used to form the ESC substrate support 111A, by use of an AC power supply 165. In one embodiment, the one or more conductive elements 114 are spaced a distance from the biasing electrode 112, and thus are not directly connected to the biasing electrode 112. As will be discussed further in conjunction with FIG. 2, the heater element 113 may include a plurality of heating zones, such as an inner heater zone 113A that includes a first conductive element 114A and outer heater zone 113B that includes a second conductive element 114B.

In one embodiment of the processing chamber 100, a filter assembly 160 is disposed between the AC power supply 165 and the one or more conductive elements 114 to prevent any RF leakage, which is provided from an RF biased biasing electrode 112 to the one or more conductive elements 114, from flowing into the AC power supply 165 and damaging its internal components and/or creating an unsafe condition for a user of the processing tool. The configuration of the filter assembly 160 is discussed in more detail below.

The biasing electrode 112 is spaced apart from the substrate receiving surface 115 of the ESC substrate support 111A, and thus from the substrate 110, by a layer of dielectric material of the ESC substrate support 111A. Typically, the layer of dielectric material has a thickness between about 0.1 mm and about 1 mm, such as between about 0.1 mm and about 0.5 mm, for example about 0.3 mm. Herein, the biasing electrode 112 is electrically coupled to the power generator 150 using the external conductor, such as the transmission line 151. The power generator 150 can be direct current (DC) power generator, a low frequency RF power generator or a shaped pulsed DC bias power generator. A version of the pulsed direct current (DC) power generator is described further below. The dielectric material and layer thickness formed between biasing electrode 112 and the substrate receiving surface 115 can be selected so that the capacitance $C_3$ (FIG. 2) of the layer of dielectric material is between about 5 nF and about 12 nF, such as between about 7 and about 10 nF, for example.

The processing chamber 100 further includes a system controller 134. The system controller 134 herein includes a central processing unit (CPU), a memory, and support circuits. The system controller 134 is used to control the process sequence used to process the substrate 110 including the substrate biasing methods described herein. The CPU is a general purpose computer processor configured for use in an industrial setting for controlling processing chamber and sub-processors related thereto. The memory described herein may include random access memory, read only memory, floppy or hard disk drive, or other suitable forms of digital storage, local or remote. The support circuits are conventionally coupled to the CPU and comprise cache, clock circuits, input/output subsystems, power supplies, and the like, and combinations thereof. Software instructions and data can be coded and stored within the memory for instructing a processor within the CPU. A program (or computer instructions) readable by the system controller 134 determines which tasks are performable by the components in the processing chamber 100. Preferably, the program, which is readable by the system controller 134, includes code, which when executed by the processor, perform tasks relating to the monitoring and execution of the electrode biasing scheme described herein. The program will include instructions that are used to control the various hardware and electrical components within the processing chamber 100 to perform the various process tasks and various process sequences used to implement the electrode biasing scheme described herein.

Figure 2:
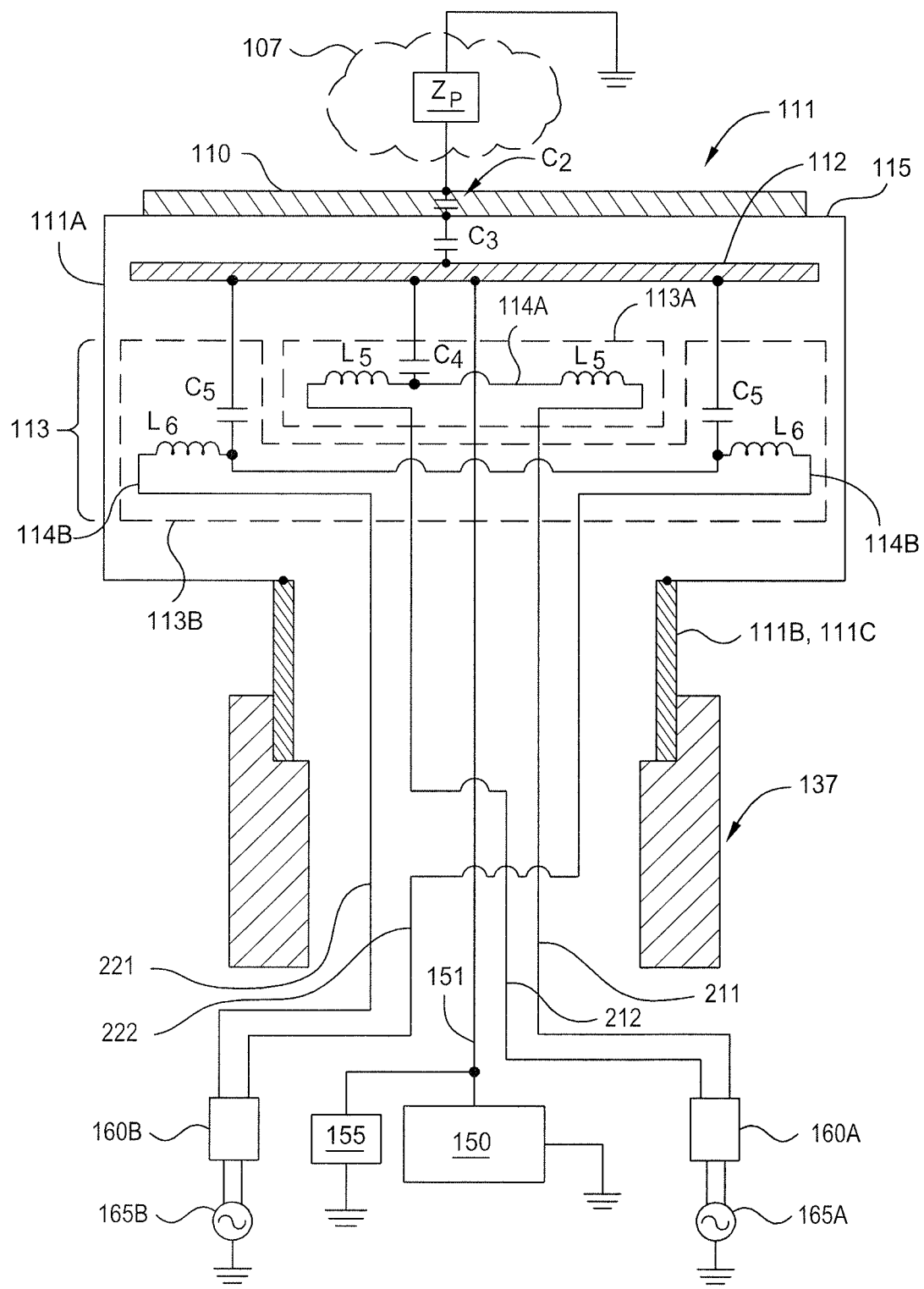
FIG. 2 is a schematic cross-sectional view of an example of a substrate support assembly, according to one embodiment.

FIG. 2 is a schematic side cross-sectional view of portions of the substrate support 111 and various supporting electrical components illustrated in FIG. 1. As previously discussed, the heater element 113, which is embedded within ESC substrate support 111A, includes a plurality of heating zones, such as an inner heater zone 113A that includes a first conductive element 114A and outer heater zone 113B that includes a second conductive element 114B. A first side of the first conductive element 114A is coupled to a first conductive lead 211 and a second side of the first conductive element 114A is coupled to a second conductive lead 212. The first conductive lead 211 and the second conductive leads 212 are connected to a first power supply 165A through a first filter assembly 160A. Similarly, a first side of the second conductive element 114B is coupled to a first conductive lead 221 and a second side of the second conductive element 114B is coupled to a second conductive lead 222. The first conductive lead 221 and the second conductive lead 222 are connected to a second power supply 165B through a second filter assembly 160B. While FIG. 2 includes a first power supply 165A and a second power supply 165B this configuration is not intended to limit the scope of the disclosure provided herein since any number of power delivering elements could be used to separately control the power delivered to the first and second heating elements 114A and 114B. The power supply 165, or power supplies 165A and 165B, and conductive element 114, or first conductive element 114A and second conductive element 114B, are typically configured to generate between about 5000 watts and about 15,000 watts of power to heat the substrate support 111 to a desirable temperature. Therefore, in one example, the power supply 165, or power supplies 165A and 165B, are configured to deliver between about 5000 watts and about 15000 watts of power at a voltage of 208 volts, and thus the conductive leads 211, 212, 221 and 222 typically require a large gauge wire, such as at least a 10 AWG to 14 AWG shielded wire. In one embodiment, the conductive leads 211, 212, 221 and 222 include a wire that has cross-sectional area that is greater than or equal to a 14 AWG wire.

During operation the power generator 150 is configured to provide nano-second DC pulses, or in some configurations RF power, to the biasing electrode 112 which is capacitively coupled to the plasma 107 through a plurality of series capacitances that can include an ESC capacitance $C_3$ and a substrate capacitance $C_2$. The plasma 107 will generally have an impedance $Z_p$ that includes a series of complex impedances due to the formed plasma and plasma sheaths formed at the chamber walls and over the substrate 110. The dielectric layer in the electrostatic chuck and the substrate 110 (e.g., a 0.8 mm thick doped-silicon slab with the capacitance $C_2$ of >10 nF) separate the biasing electrode 112 from the plasma 107 and are represented in the circuits in FIG. 2 by capacitors $C_3$ and $C_2$. Since the substrate capacitance $C_2$ is typically very large (>10 nF), or substrate may be conductive (infinite capacitance), the series capacitance is determined primarily by the actual ESC capacitance $C_3$ (e.g., ~6.8 nF). The biasing electrode 112 will also be capacitively coupled to the first conductive element 114A and second conductive element 114B, as represented by the capacitances $C_4$ and $C_5$ in FIG. 2, respectively. The capacitive coupling of the biasing electrode 112 to the first conductive element 114A and second conductive element 114B will cause RF leakage currents (or also referred to herein as noise currents) to travel through the conductive leads 211, 212, 221 and 222 to their respective first and second filter assemblies 160A and 160B. The first and second filter assemblies 160A and 160B are thus positioned and configured to filter out these unwanted RF leakage currents so as to prevent the generated RF currents from damaging either of the power supplies 165A and 165B and/or causing a personnel safety issue.

Figure 3:
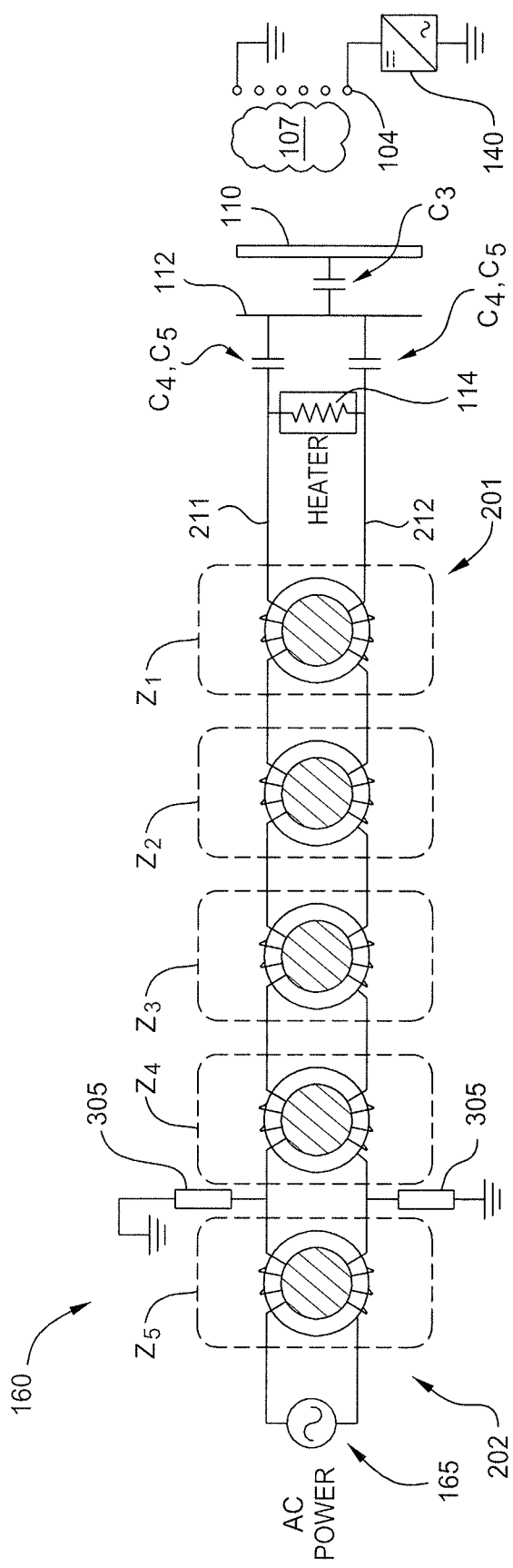
FIG. 3 is a schematic diagram of a filter assembly coupled to one or more electrical components disposed within a plasma processing chamber, according to one embodiment.
Figure 4:
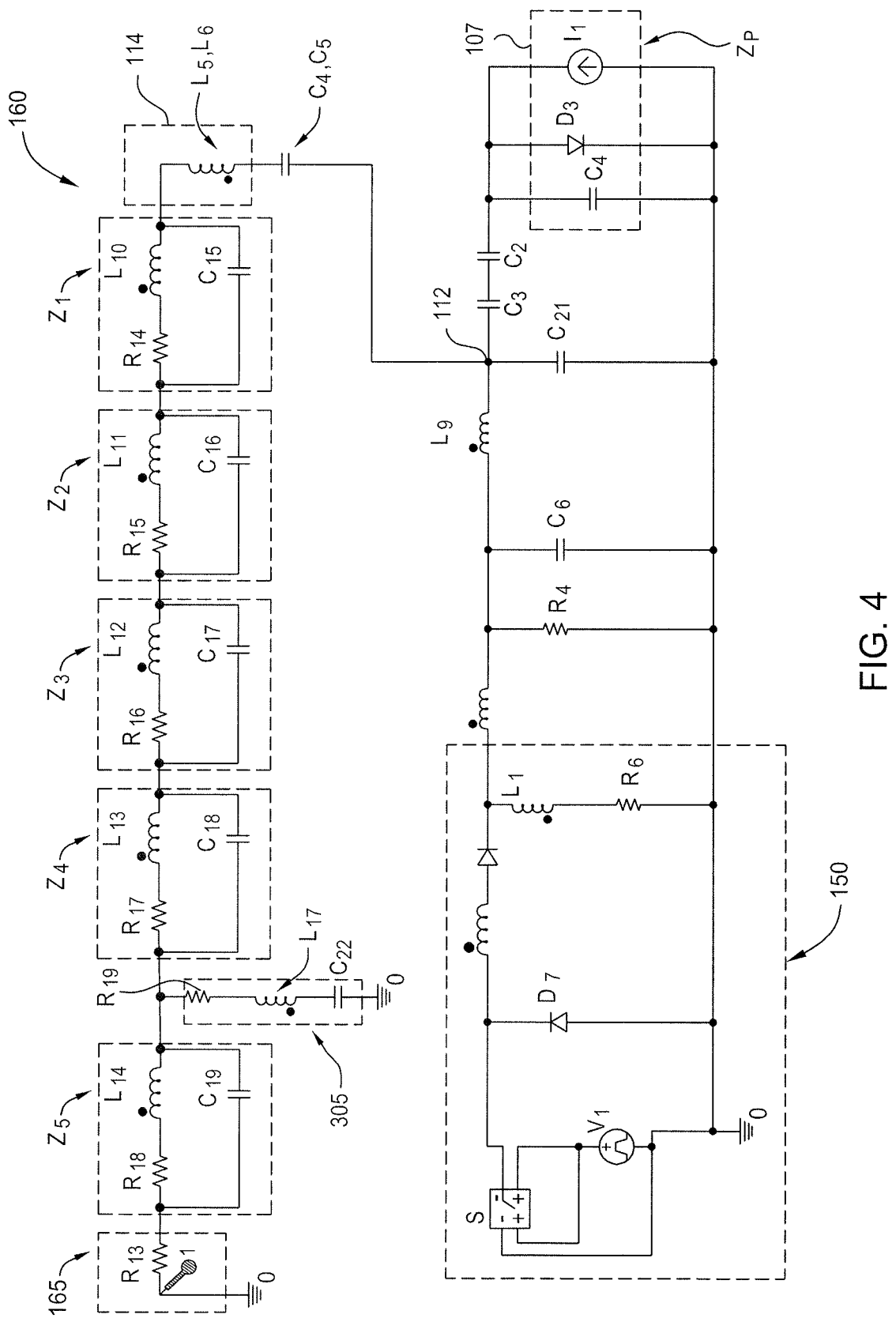
FIG. 4 is a schematic diagram of a filter assembly coupled to one or more electrical components disposed within a pulsed direct current power delivery system disposed within a plasma processing chamber, according to one embodiment.

FIG. 3 is a schematic diagram of a filter assembly 160 (FIG. 1) that is coupled between a conductive element 114 and a power supply 165 that is disposed within a plasma processing chamber, according to one embodiment. FIG. 4 is a schematic diagram of the filter assembly 160 that is coupled between the conductive element 114 and the power supply 165 that is disposed within a plasma processing chamber 100, according to one embodiment. As discussed above, the filter assembly 160 is positioned and configured to prevent the RF leakage current passing from the biasing electrode 112 to the conductive element 114 from reaching the power supply 165. The filter assembly 160 includes a plurality of impedance producing elements $Z_i$ that are connected together between an input end 201 and an output end 202, via the conductive leads 211 and 212. The filter assembly 160 also includes a grounded impedance element 305 that is connected to a conductive lead 211 or 212 at a point positioned between the last two of the connected impedance producing elements, such as impedance producing elements $Z_4$ and $Z_5$ in FIG. 3, and ground.

In one embodiment, as shown in FIGS. 3 and 4, the plurality of impedance producing elements include five impedance producing elements $Z_1$, $Z_2$, $Z_3$, $Z_4$ and $Z_5$ that are connected in series via the conductive leads 211 and 212. In general, the plurality of impedance producing elements includes at least two impedance producing elements that each at least include an inductive element (L). As illustrated in FIG. 4, each of the impedance producing elements includes a "real" inductive element (L) that includes a resistance (R) of the wire in the windings and has a self-capacitance (C). The grounded impedance elements 305 will includes a capacitive element (C) and a resistive element (R) that are connect in series between one of the conductive leads 211 or 212 and ground. One will note that the inductance ($L_{17}$) found in the grounded impedance element 305 shown in FIG. 4 has been added for modeling purposes to account for the windings of the wiring connecting the capacitive element and resistive element, and thus is not an added discrete element. In one embodiment, the impedance of each of the plurality of impedance producing elements increases from the first impedance producing element $Z_1$ near the input end 201 to the impedance producing element before the grounded impedance element 305 (e.g., impedance producing element $Z_4$ in FIG. 3). In one example, the impedance of the impedance producing elements increase (e.g., inductive elements $L_1<L_2<L_3<L_4$), while the last impedance producing element $Z_5$ has an impedance that is higher than the impedance of element 305. In one embodiment, the inductive element (L) in each of the impedance producing elements increase, such that $L_{10}<L_{11}<L_{12}<L_{13}$, as shown in FIG. 4.

In another embodiment, the impedances of at least two of the series connected impedance producing elements have the same value of impedance. In one example, a first impedance producing element $Z_1$ and a second impedance producing element $Z_2$ each have a first impedance value, and a third impedance producing element $Z_3$ and a forth impedance producing element $Z_4$ each have a second impedance value that is different from the first impedance value. In this example, the first impedance value is preferably less than the second impedance value.

In some embodiments, the impedance producing elements $Z_i$ each comprise a common mode choke that is formed by winding the conductive leads 211 and 212 around a toroid shaped core that is wound in a "Common Mode" configuration. In one example, the toroid shaped core is a toroid shaped ferrite containing core, but the core could also be made of other high magnetic permeability materials. In a common mode winding configuration, the RF leakage current (noise current) travels on both conductive leads 211 and 212 in the same direction (i.e., from the input end 201 to the output end 202) and the AC current, provided from the power supply 165 to generate heat in the conductive element 114, flows in opposing directions relative to the winding direction of the conductive leads 211 and 212 on the toroid. The two or more windings in the common mode choke are arranged such that the common mode current creates a magnetic field that opposes any increase in the common mode current. In one embodiment, the impedance of the impedance producing elements are adjusted by altering the number of turns of the windings, selecting a toroid that contain materials that have a different permeability (μ) and/or both. It is believed that by including a plurality of impedance producing elements that each have a different impedance with the filter assembly 160, the noise currents (RF leakage currents) that travel along the conductive leads 211 and 212 can be effectively eliminated or minimized so that the attached electrical components (e.g., power supply 165) are not affected by the RF leakage. The differing impedance of the impedance producing elements is used to block RF leakage currents that have different frequencies. In one example, a filter assembly 160 that has impedance producing elements that each have an increasing inductance (L) will tend to block the higher frequency noise currents first and then incrementally block noise currents having decreasing frequencies as the noise current passes from the input end 201 to the output end 202 through each successive impedance producing element $Z_i$.

The grounded impedance element 305 is configured to have a desired RC value and the last impedance element (e.g., $Z_5$) is sized such they will cause any remaining noise current(s) flowing on the conductive leads 211 or 212 to flow to ground. In one embodiment, the last impedance element (e.g., $Z_5$) is a common mode choke that includes a toroid core that is formed from a high permeability material that has a higher permeability (μ) than the permeability (μ) of the material used to form the toroid core in at least the first impedance producing element $Z_1$. In general, by selecting a desired number of impedance producing elements and their impedances to effectively block all of the RF leakage current(s) provided across a range of frequencies, the amount of current that flows through the grounded impedance element 305 to ground will be small and thus avoid any issues of a leakage current being provided to ground. In one embodiment, the combination of a desired number of impedance producing elements and the configuration of the grounded impedance element(s) 305 is used to limit the output current, which passes through a grounded impedance element 305, to less than 150 mA.

As noted above, FIG. 4 is a schematic diagram of the filter assembly 160 that is coupled between the conductive element 114 and the power supply 165 that is disposed within a plasma processing chamber 100. In this example, the power generator 150 is a pulsed bias generator that is used to establish a pulsed voltage waveform at the biasing electrode 112 of the plasma 107. The biasing electrode 112 is separated from the substrate by a thin layer of a dielectric material within the ESC assembly (e.g., thin dielectric layer that forms the capacitance $C_3$). The power generator 150 is configured to generate a pulsed voltage biasing scheme that enables maintaining a nearly constant plasma sheath voltage over the substrate 110 for up to about 90% of the substrate processing time, which results in a single (narrow) peak ion energy distribution function (IEDF).

An example of a pulsed voltage biasing scheme provided from the power generator 150 can include delivering an output voltage ($V_O$) having a magnitude $V_m$ during the time interval when an internal power generator switch S is in the closed (On) position, and a substantially constant positive output voltage (equal to $V_m$) is maintained. The voltage ($V_m$) can be as high as several kilovolts (e.g., 0.1-10 kV). The time interval during which the switch remains in the closed (On) position and the substantially constant positive output voltage is maintained is referred to as the "pulse width", $\tau_p$, and it can be as long as several tens of nanoseconds (e.g., 10-100 ns). In turn, the time interval after the switch S has transferred to the closed (On) position and the voltage ($V_m$) is achieved is referred to as the "rise time", $\tau_{rise}$, and it can also be several tens of nanoseconds (e.g., 25-50 ns). As the switch transitions from the open to the closed position, the output voltage of the nanosecond pulse generator gradually increases until it reaches the voltage $V_m$. Finally, the length of time between the two consecutive transitions from the switch S transferring from an open (Off) position to the closed (On) position (or vice versa) is referred to as the "period", T, and it is equal to the inverse of the pulse repetition frequency, which can be as high as 400 kHz, for example.

The broadband frequency filter assembly disclosed herein has a significant advantage over conventional filter designs, since it is configured to filter out and minimize the transfer of leakage currents provided at a wide range of frequencies. The configurations disclosed herein will also minimize the distortion of pulses provided to a biasing electrode, minimize the leakage current delivered to ground at the output end of the filter assembly to a value less than 150 mA, and the amount of heat generated by the various impedance producing elements will be significantly lower than conventional filter designs that are similarly connected in the same plasma processing apparatus due to the configuration of the impedance producing elements. As discussed above, some of the desirable impedance producing element configuration details will include, but are not limited to the orientation of the serially connected impedance producing elements relative to the input end of the filter assembly, the wiring types and winding configurations of each of the impedance producing elements, and the selection of the materials that the toroidal cores in each of the impedance producing elements are formed from.

The invention claimed is:

1. A filter assembly for minimizing RF interference with an AC power supply, comprising:
    a first conductive lead and a second conductive lead;
    an output end of the filter assembly wherein the first conductive lead and a second conductive lead are configured to be electrically coupled to an AC power supply;
    an input end of the filter assembly;
    a first impedance producing element electrically coupled to the first conductive lead and the second conductive lead at the output end of the filter assembly;
    a plurality of second impedance producing elements electrically coupled in series between the first impedance producing element and the input end of the filter assembly, each impedance producing element of the plurality of second impedance producing elements comprising:
    a portion of the first conductive lead wound around a portion of a toroid shaped core; and
    a portion of the second conductive lead wound around a portion of the toroid shaped core, wherein an inductance for each series coupled second impedance producing element of the plurality of second impedance producing elements increases from the input end to a point disposed between the plurality of second impedance producing elements and the first impedance producing element;
    a first grounded impedance producing element, the first grounded impedance producing element is coupled to the first conductive lead at the point disposed between the plurality of second impedance producing elements and the first impedance producing element; and
    a second grounded impedance producing element, the second grounded impedance producing element is coupled to the second conductive lead at the point disposed between the plurality of second impedance producing elements and the first impedance producing element, wherein
    the first impedance producing element comprises a first inductance element,
    the first grounded impedance producing element and the second grounded impedance producing element each comprise a capacitance element, and
    an impedance of the first inductance element on the first conductive lead is greater than an impedance produced by the capacitance element of the first grounded impedance producing element and an impedance of the first inductance element on the second conductive lead is greater than an impedance produced by the capacitance element of the second grounded impedance producing element at an interfering radio frequency (RF).

2. The filter assembly of claim 1, wherein the portion of the first conductive lead wound around the portion of the toroid shaped core and the portion of the second conductive lead wound around the portion of the toroid shaped core are wound in a common mode choke configuration.

3. The filter assembly of claim 1, wherein the input end is electrically coupled to a resistive heating element.

4. The filter assembly of claim 3, wherein the output end is coupled to an AC power supply.

5. The filter assembly of claim 1, wherein the first conductive lead is coupled to a first side of a resistive heating element and the second conductive lead is coupled to a second side of the resistive heating element.

6. The filter assembly of claim 5, wherein an AC power supply is configured to provide an AC current to the first conductive lead and receive a returning AC current on the second conductive lead.

7. The filter assembly of claim 1, wherein the first conductive lead and the second conductive lead comprise a wire that has cross-sectional area that is greater than or equal to a 14 AWG wire.

8. The filter assembly of claim 1, wherein
the toroid shaped core in a first impedance element of the plurality of second impedance producing elements comprises a first material that has a first permeability, and
the toroid shaped core in a second impedance element of the plurality of second impedance producing elements comprises a second material that has a second permeability that is greater than the first permeability, and
the first impedance element of the plurality of second impedance producing elements is positioned closer to the input end of the filter assembly and the second impedance element of the plurality of second impedance producing elements is positioned closer to the output end of the filter assembly.

9. The filter assembly of claim 1, wherein the portion of the first conductive lead wound around the portion of the toroid shaped core and the portion of the second conductive lead wound around the portion of the toroid shaped core are wound in opposing directions around the toroidal shaped core.

10. A plasma processing chamber, comprising:
a biasing electrode disposed within a substrate support, wherein the biasing electrode is configured to be driven by a power generator;
a conductive element disposed within the substrate support and positioned a distance from the biasing electrode;
a filter assembly that comprises:
a first conductive lead and a second conductive lead;
an output end of the filter assembly wherein the first conductive lead and a second conductive lead are configured to be electrically coupled to a power supply;
an input end of the filter assembly;
a first impedance producing element electrically coupled to the first conductive lead and the second conductive lead at the output end of the filter assembly;
a plurality of second impedance producing elements electrically coupled in series between the first impedance producing element and the input end of the filter assembly, each second impedance producing element of the plurality of second impedance producing elements comprising:
a portion of the first conductive lead wound around a portion of a toroid shaped core; and
a portion of the second conductive lead wound around a portion of the toroid shaped core, wherein an impedance for each series coupled second impedance producing element of the plurality of second impedance producing elements increases from the input end to a point disposed between the plurality of second impedance producing elements and the first impedance producing element;
a first grounded impedance producing element, the first grounded impedance producing element is coupled to the first conductive lead at the point disposed between the plurality of second impedance producing elements and the first impedance producing element; and
a second grounded impedance producing element, the second grounded impedance producing element is coupled to the second conductive lead at the point disposed between the plurality of second impedance producing elements and the first impedance producing element, wherein
the first impedance producing element comprises a first inductance element,
the first grounded impedance producing element and the second grounded impedance producing element each comprise a capacitance element, and
an impedance of the first inductance element on the first conductive lead is greater than an impedance produced by the capacitance element of the first grounded impedance producing element and an impedance of the first inductance element on the second conductive lead is greater than an impedance produced by the capacitance element of the second grounded impedance producing element at an operating radio frequency (RF) applied to the bias electrode.

11. The plasma processing chamber of claim 10, wherein the portion of the first conductive lead wound around the portion of the toroid shaped core and the portion of the second conductive lead wound around the portion of the toroid shaped core are wound in a common mode choke configuration.

12. The plasma processing chamber of claim 10, wherein the conductive element comprises a resistive heating element.

13. The plasma processing chamber of claim 12, wherein conductive element is coupled to an AC power supply.

14. The plasma processing chamber of claim 10, wherein the first conductive lead and the second conductive lead comprise a wire that has cross-sectional area that is greater than or equal to a 14 AWG wire.

15. The plasma processing chamber of claim 10, wherein
the toroid shaped core in a first impedance element of the plurality of second impedance producing elements comprises a first material that has a first permeability, and
the toroid shaped core in a second impedance element of the plurality of second impedance producing elements comprises a second material that has a second permeability that is greater than the first permeability, and
the first impedance element of the plurality of second impedance producing elements is positioned closer to the input end of the filter assembly and the second impedance element of the plurality of second impedance producing elements is positioned closer to the output end of the filter assembly.

16. The plasma processing chamber of claim 10, wherein the portion of the first conductive lead wound around the portion of the toroid shaped core and the portion of the second conductive lead wound around the portion of the toroid shaped core are wound in opposing directions around the toroidal shaped core.

* * * * *